United States Patent
Tauchi et al.

[11] Patent Number: 6,147,293
[45] Date of Patent: Nov. 14, 2000

[54] PROCESS FOR PRODUCING SINTERED THERMOELECTRIC SEMICONDUCTOR AND SINTERED THERMOELECTRIC SEMICONDUCTOR

[75] Inventors: Hitoshi Tauchi; Satoru Hori; Joji Hachisuka; Makoto Yamazaki; Masayoshi Ando, all of Aichi-ken, Japan

[73] Assignee: Aisin Seiki Kabushiki Kaisha, Kariya, Japan

[21] Appl. No.: 09/177,494

[22] Filed: Oct. 23, 1998

[30] Foreign Application Priority Data

Oct. 30, 1997 [JP] Japan ................... 9-298784

[51] Int. Cl.[7] .................................. H01L 35/12
[52] U.S. Cl. ............. 136/236.1; 136/240; 136/201; 136/238; 419/47; 419/48
[58] Field of Search ................. 420/579; 419/47, 419/48; 136/201, 238, 240, 236.1; 252/519.13, 519.14, 519.15

[56] References Cited

U.S. PATENT DOCUMENTS

| | | |
|---|---|---|
| 3,162,531 | 12/1964 | Yamano et al. |
| 3,220,199 | 11/1965 | Hanlein et al. |
| 3,228,805 | 1/1966 | Waseleski, Jr. et al. |
| 4,764,212 | 8/1988 | Okumura et al. ............ 75/228 |
| 5,108,515 | 4/1992 | Ohta et al. ............... 136/201 |
| 5,448,109 | 9/1995 | Cauchy ................... 257/712 |
| 5,763,293 | 6/1998 | Yamashita et al. ......... 438/55 |

*Primary Examiner*—Ngoclan Mai
*Attorney, Agent, or Firm*—Oblon, Spivak, McClelland, Maier & Neustadt, P.C.

[57] ABSTRACT

A process for producing a sintered thermoelectric semiconductor includes a first step of forming bulk crystals of a thermoelectric semiconductor and a second step of hot extrusion. The second step includes substeps of placing the bulk crystals in the cavity of a heated extrusion die, pushing the ram into the cavity, thereby compressing and crushing the bulk crystals and turning them into a molten or semi-molten state, and finally extruding the molten or semi-molten crystals, thereby sintering them and forming a sintered thermoelectric semiconductor.

7 Claims, 3 Drawing Sheets

PROCESS FOR PRODUCING SINTERED THERMOELECTRIC SEMICONDUCTOR AND SINTERED THERMOELECTRIC SEMICONDUCTOR

BACKGROUND OF THE INVENTION

1. Field of the Invention

The invention is directed to thermoelectric semiconductors in sintered form.

2. Description of the Related Art

Thermoelectric semiconductors in sintered form (referred to as sintered thermoelectric semiconductors hereinafter) are conventionally produced by a process which consists of preparing an alloy of thermoelectric semiconductor in bulk crystal form by the known crystal growth method, pulverizing it with a mill, classifying the resulting crystal powder and sintering the powder of desired particle size by hot pressing or hot extrusion. This conventional process needs as many as four steps, which leads to the disadvantage of requiring heavy investment and large space, resulting in poor productivity. In addition, the pulverizing step and its ensuing classifying step involve the cumbersome handling of powder.

SUMMARY OF THE INVENTION

At is an object of the present invention to address the technical problems mentioned above.

It is a further object of the present invention to provide a process for producing sintered thermoelectric semiconductors in a simple manner without the pulverizing step which needs careful attention to powder handling.

It is a further object of the present invention to provide a process for producing sintered thermoelectric semiconductors which needs a fewer number of steps, requires less investment and space, and permits improved productivity.

It is yet another object of the present invention to provide a sintered thermoelectric semiconductor produced by said process.

According to a first aspect of the invention, the above and other objects are addressed by a process for producing a sintered thermoelectric semiconductor, comprising a first step of forming bulk crystals of thermoelectric semiconductor and a second step of hot extrusion, which includes substeps of placing said bulk crystals in the cavity of a heated extrusion die, pushing the ram into said cavity, thereby compressing and crushing the bulk crystals and turning them into a molten or semi-molten state, and finally extruding the molten or semi-molten crystals, thereby sintering them and forming a sintered thermoelectric semiconductor.

According to said first aspect, the bulk crystals of thermoelectric semiconductor formed in the first step are placed as such (without being pulverized) in the cavity of a heated extrusion die, and are subsequently crushed there by the application of compressive force. The crushed crystals take on a molten or semi-molten state due to heat. The melt is extruded from the die by the ram. During extrusion, the melt receives additional heat from the die and becomes sintered. In this way there is obtained a sintered thermoelectric semiconductor.

This process requires only two steps of crystal forming and hot extrusion. It offers the advantage over the conventional technology of requiring less investment and space and improving productivity. The absence of the pulverizing and classifying steps permits one to produce the sintered thermoelectric semiconductor in a simple manner without paying attention to the handling of powder.

The fact that the crystals take on a molten or semi-molten state before sintering permits the reduction of extrusion pressure. This leads to a size reduction of the manufacturing equipment and also to the sintered product having an improved Seebeck coefficient and electrical conductivity. A probable reason for this effect is the displacement of atoms in crystals in the molten or half-molten state, which relieves the segregation that has occurred in the crystal forming step, making the internal composition uniform. In addition, it is assumed that the sintered body which forms as the molten or semi-molten material solidifies has grain boundaries where atoms are in close contact with one another, thereby contributing to the improved electrical conductivity. The sintered thermoelectric semiconductor thus obtained exhibits improved cooling performance owing to the improved Seebeck coefficient and electrical conductivity.

According to a second aspect of the invention, the above and other objects are addressed by a process for producing a sintered thermoelectric semiconductor as defined above, wherein the hot extrusion step is carried out while keeping the extrusion die at 250° C. and above. This condition is necessary to supply sufficient heat to the crystals, thereby turning them into the molten or semi-molten state in the hot extrusion step. The consequence is the reduced extrusion pressure, the relieved segregation in crystals, and the improved bond in grain boundaries. Thus the resulting sintered thermoelectric semiconductor is superior in cooling performance.

According to a third aspect of the invention, the above and other objects are addressed by a process for producing a sintered thermoelectric semiconductor as defined above, wherein the hot extrusion step is carried out by advancing the ram in the cavity at a controlled speed such that the sintered thermoelectric semiconductor is extruded at a rate lower than 15 mm/s. Extrusion in this manner permits the crystals to have sufficient time for their heating, thereby turning them into the semi-molten state with certainty in the hot extrusion step. The consequence is the reduced extrusion pressure, the relieved segregation in crystals, and the improved bond in grain boundaries. Thus the resulting sintered thermoelectric semiconductor is superior in cooling performance.

According to a fourth aspect of the invention, the above and other objects are addressed by a sintered thermoelectric semiconductor which comprises a sintered body formed from bulk crystals of thermoelectric semiconductor by hot extrusion in which the bulk crystals are crushed, turned into the molten or semi-molten state, and sintered. This sintered thermoelectric semiconductor offers the advantage of requiring no additional steps of pulverizing bulk crystals and classifying the resulting powder. The fewer number of steps contributes to lower investment, smaller space, and improved productivity. The absence of the pulverizing and classifying steps eliminates the necessity of paying attention to the handling of powder.

The fact that the crystals take on a molten or semi-molten state before sintering permits the reduction of extrusion pressure. This leads to the reduction of manufacturing equipment in size and also to the sintered body having an improved Seebeck coefficient (due to relieved segregation in crystals) and electrical conductivity (due to close contact at grain boundaries in the sintered body). The resulting sintered thermoelectric semiconductor exhibits improved cooling performance.

According to a fifth aspect of the invention, the above and other objects are addressed by a sintered thermoelectric semiconductor defined as above, in which crystal grains smaller than 10 μm in maximum diameter account for 90% and above by volume. The presence of fine crystal grains as specified above is an indication of whether the bulk crystals have turned into the molten or semi-molten state satisfactorily, because new crystal nuclei form in the molten or semi-molten state and crystals grow from them. The grown crystals show themselves as fine crystal grains smaller than 10 μm in diameter. Therefore, the fact that crystal grains having the maximum particle diameter smaller than 10 μm account for 90% and above by volume indicates that the bulk crystals have turned into the molten or semi-molten state satisfactorily, resulting in relived segregation, improved bond at grain boundaries, and remarkably improved cooling performance. Failure to meet this requirement is an indication of insufficient melting or semi-melting, insufficient relief of segregation, insufficient bond at grain boundaries and insufficient cooling performance.

According to a sixth aspect of the invention, the above and other objects are addressed by a sintered thermoelectric semiconductor which comprises a sintered body formed from bulk crystals of thermoelectric semiconductor of P-type whose principal component is represented by the formula below.

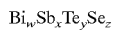

$Bi_wSb_xTe_ySe_z$ (where $0.4 \leq w \leq 2.0$, $x \leq 1.6$, $2.7 \leq y \leq 3.25$, $z \leq 0.3$)

The P-type thermoelectric semiconductor, which may be a binary one composed of Bi and Te or a ternary or quaternary one composed of Bi, Te, and either or both of Sb and Se, should have molar ratios as specified above by w, x, y, and z. It is this semiconductor which yields the sintered thermoelectric semiconductor of P-type having satisfactory performance. With molar ratios outside the specified range, the semiconductor will not produce the desired effect.

The seventh invention to address the foregoing technical problems covers a sintered thermoelectric semiconductor which comprises a sintered body formed from bulk crystals of thermoelectric semiconductor of N-type whose principal component is represented by the formula below.

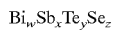

$Bi_wSb_xTe_ySe_z$ (where $1.4 \leq w \leq 2.0$, $x \leq 0.6$, $2.7 \leq y \leq 3.0$, $z \leq 0.3$)

The N-type thermoelectric semiconductor, which may be a binary one composed of Bi and Te or a ternary or quaternary one composed of Bi, Te, and either or both of Sb and Se, should have molar ratios as specified above by w, x, y, and z. It is this semiconductor which yields the sintered thermoelectric semiconductor of N-type having satisfactory performance. With molar ratios outside the specified range, the semiconductor will not produce the desired effect.

DETAILED DESCRIPTION OF THE PREFERRED EMBODIMENTS

The invention will be described in more detail with reference to the accompanying drawings.

EXAMPLE 1

This example demonstrates the production of the sintered thermoelectric semiconductor. The production process comprises a first step of forming bulk crystals of thermoelectric semiconductor and a second step of hot extrusion which includes substeps of placing said bulk crystals in the cavity of a heated extrusion die, pushing the ram into said cavity, thereby compressing and crushing the bulk crystals and turning them into a molten or semi-molten state, and finally extruding the molten or semi-molten crystals, thereby sintering them and forming a sintered thermoelectric semiconductor.

(A) Crystal Forming Step

This step started with weighing bismuth, tellurium, and selenium, each having a purity of 5N (99.999%), such that their ratio corresponds to the composition $Bi_2Te_{2.85}Se_{0.15}$ of the principal component of the thermoelectric semiconductor to be produced. They were placed in a quartz tube, together with silver bromide (AgBr) as much as 0.07 wt % for the adjustment of carrier concentration. The quartz tube was evacuated by using a vacuum pump and sealed at $1.0 \times 10^{-5}$ Torr or below.

The sealed quartz tube was heated at 900° C. for 1 hour. During heating, it was shaken so as to stir the molten mixture therein. The melt was cooled to grow a crystal of alloy. In this way there was obtained an N-type thermoelectric semiconductor in the form of a bulk crystal having the composition of $Bi_2Te_{2.85}Se_{0.15}$.

(B) Hot Extrusion Step

Figure 1:
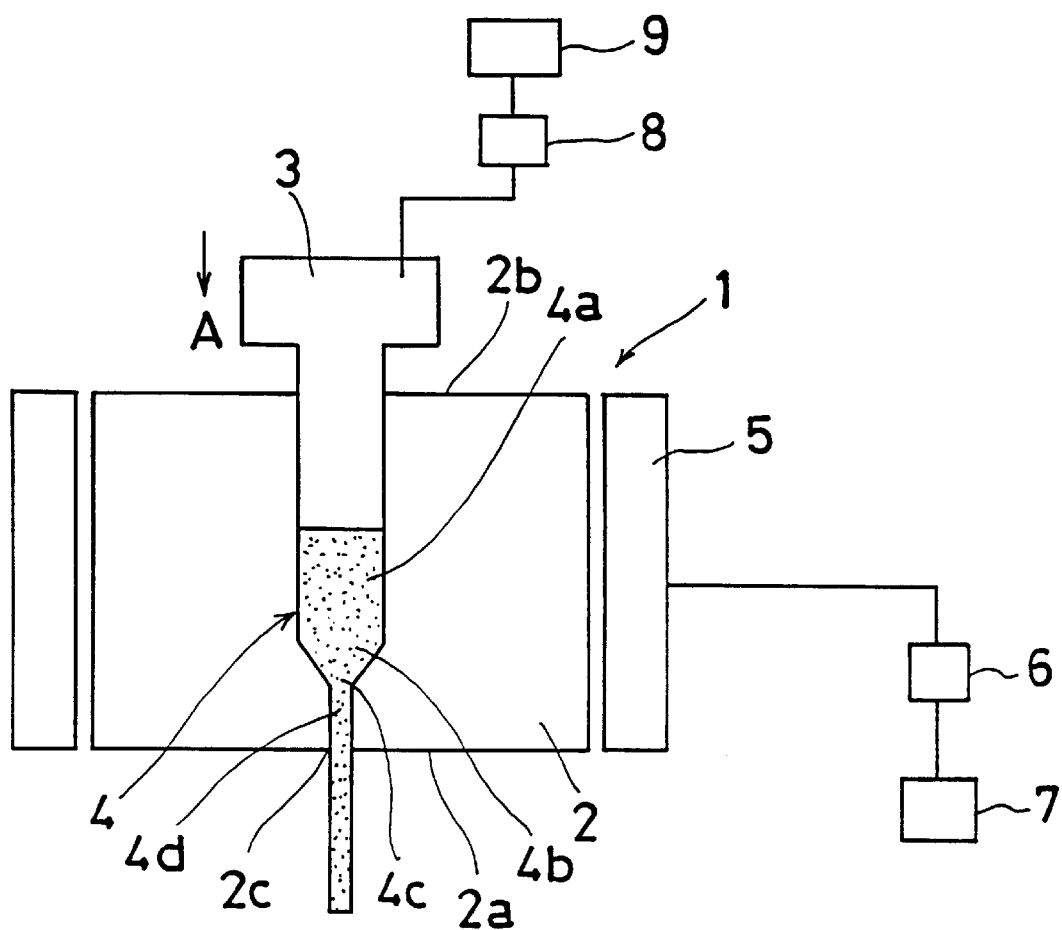
FIG. 1 is a schematic diagram showing the extrusion machine used for hot extrusion in Examples 1 and 2 and Comparative Examples 1 and 2.

The bulk crystal obtained in step A was fed to the extrusion machine as shown in FIG. 1. The extrusion machine 1 has a cylindrical die 2 and a ram 3. The die 2 has a cavity 4 formed therein. The cavity 4 consists of a cylindrical space 4a (which opens toward the backside 2b of the die) and a tapered space 4b adjacent to 4a. The tapered space 4b converges at its end 4c, which communicates, through a passage 4d, with a discharge orifice 2c which opens at the surface 2a of the die 2. The ram 3 is inserted into the cylindrical space 4a through the back side 2b of the die 2. For its heating, the die 2 is surrounded by a ring heater 5, which is electrically connected to a power source 7 through a PID or ON-OFF temperature controller 6. The ram 3 is connected to a drive source 9 (a hydraulic pump in this example) through a controller 8 to variably control the ram speed.

While the extrusion machine 1 is in operation, the die 3 is heated by the ring heater 5, with its temperature kept at 410° C. by the temperature controller 6. The bulk crystal prepared in step A is held to the cavity 4 of the die 2. With the drive source 9 turned on, the ram 3 is advanced in the direction of arrow A. The ram speed is controlled by the drive controller 8 so that the sintered thermoelectric semiconductor is discharged through the discharge orifice 2c at a rate of 4 mm/s.

The bulk crystal in the cavity 4 receives a compressive force exerted by the ram 3 advancing in the cavity 4 in the direction of arrow A. Thus it is crushed by this compressive force. Subsequently, the crushed bulk crystal receives heat from the die 3 heated by the ring heater 5 and assumes a semi-molten state. The resulting melt is forced out from the discharge orifice 2c. Incidentally, because of its tendency toward cleavage, the bulk crystal used in this example cracks easily along the cleavage plane under compressive force. Therefore, it is readily crushed in the cavity 4. As hot extrusion proceeds, the bulk crystal in the semi-molten state is gradually sintered and discharged through the discharge orifice 2c. The thus obtained product is an N-type sintered thermoelectric semiconductor.

Figure 2:
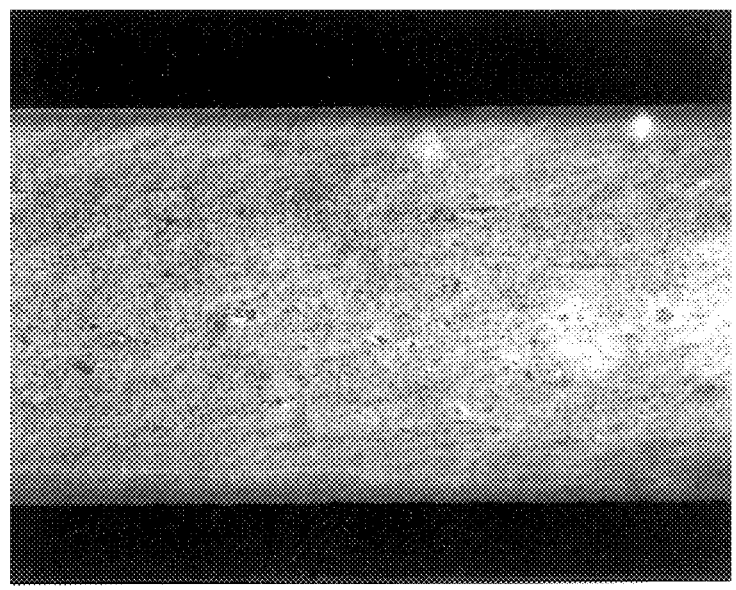
FIG. 2 is a photograph showing the microscopic structure of the sintered thermoelectric semiconductor produced in Example 1.

FIG. 2 is a photograph showing the microscopic structure of the N-type sintered thermoelectric semiconductor. It was found from this photograph that fine crystal grains smaller than 10 μm in maximum diameter account for 90% by volume.

EXAMPLE 2

This example also demonstrates the production of the sintered thermoelectric semiconductor. Like Example 1, the production process comprises a first step of forming bulk crystals of thermoelectric semiconductor and a second step of hot extrusion which includes substeps of placing said bulk crystals in the cavity of a heated extrusion die, pushing the ram into said cavity, thereby compressing and crushing said bulk crystals and turning them into a molten or semi-molten state, and finally extruding said molten or semi-molten crystals, thereby sintering them and forming a sintered thermoelectric semiconductor.

(A) Crystal Forming Step

This step started with weighing bismuth, antimony, and tellurium, each having a purity of 5N (99.999%), such that their ratio corresponds to the composition $Bi_{0.5}Sb_{1.5}Te_{3.0}$ of the principal component of the thermoelectric semiconductor to be produced. They were placed in a quartz tube, together with silver (Ag) of as much as 0.016 wt % for the adjustment of carrier concentration. The quartz tube was evacuated by using a vacuum pump and sealed at $1.0 \times 10^{-5}$ Torr or below.

The sealed quartz tube was heated at 900° C. for 1 hour. During heating, it was shaken so as to stir the molten mixture therein. The melt was cooled to grow a crystal of alloy. In this way there was obtained a P-type thermoelectric semiconductor in the form of a bulk crystal having the composition of $Bi_{0.5}Sb_{1.5}Te_{3.0}$.

(B) Hot Extrusion Step

The bulk crystal obtained in step A was fed to the extrusion machine as shown in FIG. 1. The extrusion machine is identical to that used in Example 1, and hence its detailed description is omitted.

While the extrusion machine 1 is in operation, the die 3 is heated by the ring heater 5, with its temperature kept at 430° C. by the temperature controller 6. The bulk crystal prepared in step A is fed to the cavity 4 of the die 2. With the drive source 9 turned on, the ram 3 is advanced in the direction of arrow A. The ram speed is controlled by the drive controller 8 so that the sintered thermoelectric semiconductor is discharged through the discharge orifice 2c at a rate of 4 mm/s.

The bulk crystal fed to the cavity 4 receives a compressive force exerted by the ram 3 advancing in the cavity 4 in the direction of arrow A. Thus it is crushed by this compressive force. Subsequently, the crushed bulk crystal receives heat from the die 3 heated by the ring heater 5 and assumes a semi-molten state. The resulting melt is forced out from the discharge orifice 2c. Incidentally, because of its tendency toward cleavage, the bulk crystal used in this example cracks easily along the cleavage plane under compressive force. Therefore, it is readily crushed in the cavity 4. As hot extrusion proceeds, the bulk crystal in the semi-molten state is gradually sintered and discharged through the discharge orifice 2c. The thus obtained product is a P-type sintered thermoelectric semiconductor.

Figure 3:
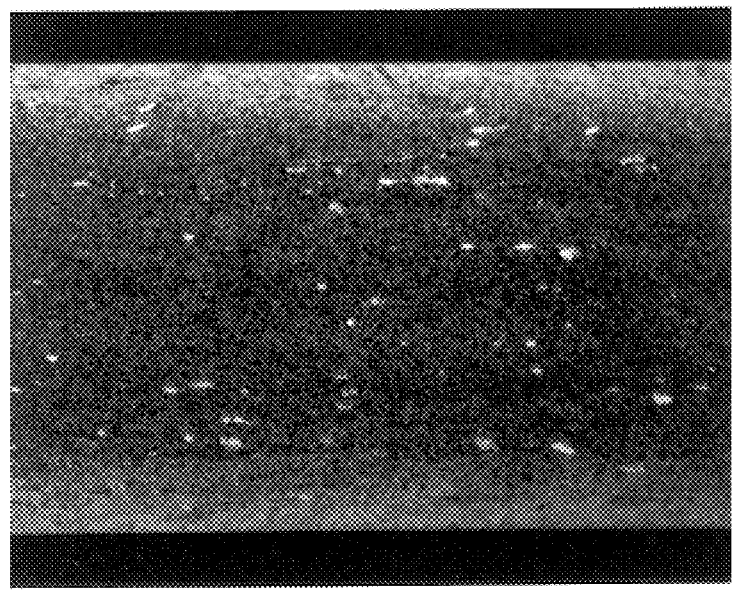
FIG. 3 is a photograph showing the microscopic structure of the sintered thermoelectric semiconductor produced in Example 2.

FIG. 3 is a photograph showing the microscopic structure of the P-type sintered thermoelectric semiconductor. It was found from this photograph that fine crystal grains smaller than 10 μm in maximum diameter account for 95% by volume.

Comparative Example 1

(A) Crystal Forming Step

This step started with weighing bismuth, tellurium, and selenium, each having a purity of 5N (99.999%), such that their ratio corresponds to the composition $Bi_{2.0}Te_{2.7}Se_{0.3}$ of the principal component of the thermoelectric semiconductor to be produced. They were placed in a quartz tube, together with mercury chloride (HgCl) and selenium (Se) as much as 0.13 wt % and 0.06 wt %, respectively, for the adjustment of carrier concentration. The quartz tube was evacuated by using a vacuum pump and sealed at $1.0 \times 10^{-5}$ Torr or below.

The sealed quartz tube was heated at 700° C. for 1 hour. During heating, it was shaken so as to stir the molten mixture therein. The melt was cooled to grow a crystal of alloy. In this way there was obtained an N-type thermoelectric semiconductor in the form of a bulk crystal having the composition of $Bi_{2.0}Te_{2.7}Se_{0.3}$.

(B) Hot Extrusion Step

The bulk crystal obtained in step A was fed to the extrusion machine as shown in FIG. 1. The extrusion machine is identical to that used in Example 1, and hence its detailed description is omitted.

While the extrusion machine 1 is in operation, the die 3 is heated by the ring heater 5, with its temperature kept at 430° C. by the temperature controller 6. The bulk crystal prepared in step A is fed to the cavity 4 of the die 2. With the drive source 9 turned on, the ram 3 is advanced in the direction of arrow A. The ram speed is controlled by the drive controller 8 so that the sintered thermoelectric semiconductor is discharged through the discharge orifice 2c at a rate of 16 mm/s.

The bulk crystal fed to the cavity 4 receives a compressive force exerted by the ram 3 advancing in the cavity 4 in the direction of arrow A. Thus it is crushed by this compressive force. Subsequently, the crushed bulk crystal is sintered and discharged through the discharge orifice 2c. Thus there was obtained a sintered thermoelectric semiconductor.

Figure 4:
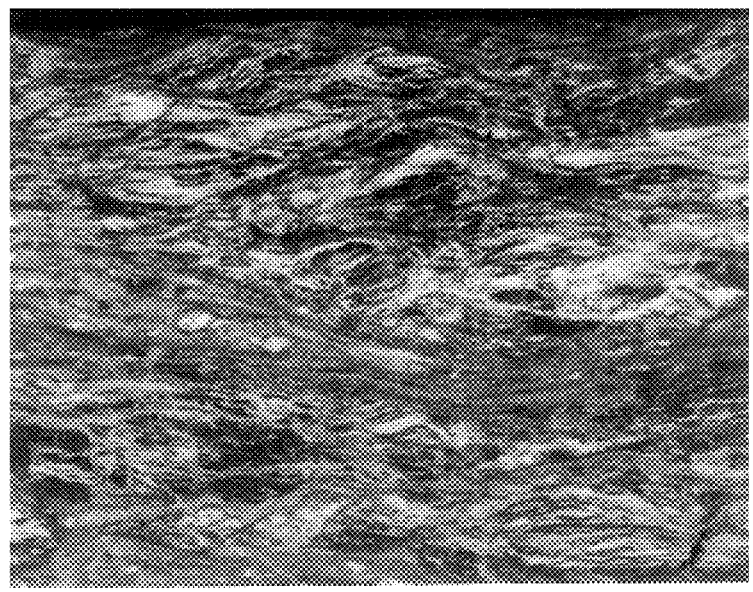
FIG. 4 is a photograph showing the microscopic structure of the sintered thermoelectric semiconductor produced in Comparative Example 1.

FIG. 4 is a photograph showing the microscopic structure of the N-type sintered thermoelectric semiconductor obtained as mentioned above. It was found from this photograph that fine crystal grains smaller than 10 μm in maximum diameter account for 70% by volume.

Comparative Example 2

(A) Crystal Forming Step

This step started with weighing bismuth, antimony, tellurium, and selenium, each having a purity of 5N (99.999%), such that their ratio corresponds to the composition $Bi_{0.5}Sb_{1.5}Te_{2.9}Se_{0.09}$ of the principal component of the thermoelectric semiconductor to be produced. They were placed in a quartz tube, together with tellurium (Te) as much as 1.5 wt % for the adjustment of carrier concentration. The quartz tube was evacuated by using a vacuum pump and sealed at $1.0 \times 10^{-5}$ Torr or below.

The sealed quartz tube was heated at 700° C. for 1 hour. During heating, it was shaken so as to stir the molten mixture therein. The melt was cooled to grow a crystal of alloy. In this way there was obtained a P-type thermoelectric semiconductor in the form of a bulk crystal having the composition of $Bi_{0.5}Sb_{1.5}Te_{2.9}Se_{0.09}$.

(B) Hot Extrusion Step

The bulk crystal obtained in step A was fed to the extrusion machine as shown in FIG. 1. The extrusion machine is identical to that used in Example 1, and hence its detailed description is omitted.

While the extrusion machine 1 is in operation, the die 3 is heated by the ring heater 5, with its temperature kept at 240° C. by the temperature controller 6. The bulk crystal prepared in step A is fed to the cavity 4 of the die 2. With the drive source 9 turned on, the ram 3 is advanced in the direction of arrow A. The ram speed is controlled by the drive controller 8 so that the sintered thermoelectric semiconductor is discharged through the discharge orifice 2c at a rate of 1 mm/s.

The bulk crystal fed to the cavity 4 receives a compressive force exerted by the ram 3 advancing in the cavity 4 in the direction of arrow A. Thus it is crushed by this compressive force. Subsequently, the crushed bulk crystal is sintered and discharged through the discharge orifice 2c. Thus there was obtained a sintered thermoelectric semiconductor.

Figure 5:
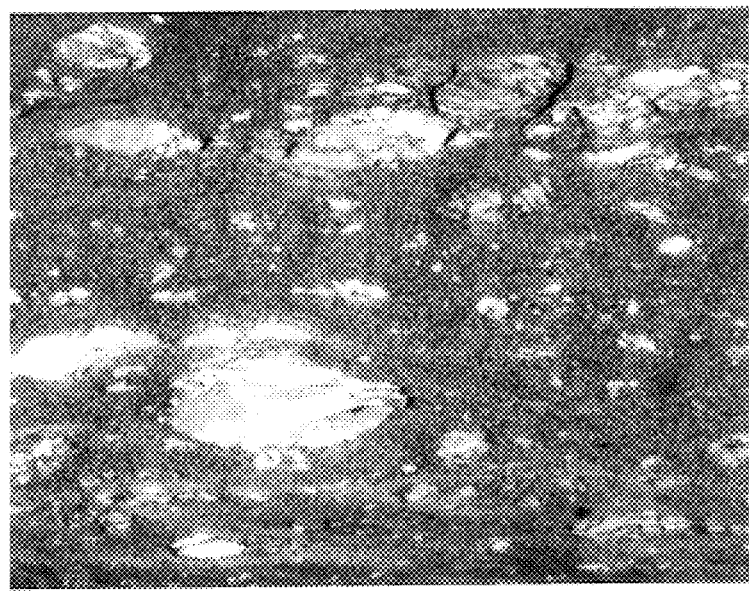
FIG. 5 is a photograph showing the microscopic structure of the sintered thermoelectric semiconductor produced in Comparative Example 2.

FIG. 5 is a photograph showing the microscopic structure of the P-type sintered thermoelectric semiconductor obtained as mentioned above. It was found from this photograph that fine crystal grains smaller than 10 μm in maximum diameter account for 60% by volume.

The above-mentioned two examples and two comparative examples are summarized in Table 1, which shows the composition of the crystal, the additives and their content, the conditions of hot extrusion step (such as temperature, speed, and pressure), and the properties of the sintered thermoelectric semiconductor (such as compressive strength, Seebeck coefficient, and electric conductivity).

duced by the process which comprises a first step of forming bulk crystals of thermoelectric semiconductor and a second step of hot extrusion which includes substeps of placing the bulk crystals in the cavity 4 of the heated extrusion die 2, pushing the ram 3 into said cavity 4, thereby compressing and crushing said bulk crystals and turning them into a molten or semi-molten state, and finally extruding the molten or semi-molten crystals, thereby sintering them and forming a sintered thermoelectric semiconductor. In other words, according to the examples mentioned above, the sintered thermoelectric semiconductor is produced by only two steps (crystal forming step and hot extrusion step). The fewer number of steps than the conventional technology contributes to a reduction of investment and space and to improved productivity. Crushing the bulk crystal in the hot extrusion step obviates the pulverizing and classifying steps required in the conventional technology. This offers the advantage of eliminating the necessity of paying attention to the handling of powder in the production of the sintered thermoelectric semiconductor.

In addition, the fact that the bulk crystal is turned into a molten state or semi-molten state in the hot extrusion step prior to sintering contributes to the reduction of extrusion pressure and the size reduction of manufacturing equipment. It also contributes to relieving segregation in the bulk crystal, the improvement of the Seebeck coefficient, and the improvement of electrical conductivity (due to close bonding at grain boundaries in the sintered body). Thus, the sintered thermoelectric semiconductor produced according to this invention exhibits improved cooling performance.

Keeping the die temperature at 250° C. and above, particularly 380° C. and above, in the hot extrusion step turns the bulk crystal into a molten or semi-molten state with certainty, with a concomitant effect of reducing the extrusion pressure and reducing the size of the manufacturing equipment. The relieving of segregation in the bulk crystal and the

|  | Example 1 | Example 2 | Comparative Example 1 | Comparative Example 2 |
|---|---|---|---|---|
| Composition | $Bi_2Te_{2.85}Se_{0.15}$ | $Bi_{0.5}Sb_{1.5}Te_{3.0}$ | $Bi_{1.2}Te_{2.7}Se_{0.3}$ | $Bi_{0.5}Sb_{1.5}Te_{2.91}Se_{0.09}$ |
| Additives (wt %) | AgBr (0.07) | Ag (0.016) | HgCl (0.13), Se (0.06) | Te (1.5) |
| Extrusion temperature (° C.) | 410 | 430 | 430 | 240 |
| Extrusion rate (mm/s) | 4 | 4 | 16 | 1 |
| Extrusion pressure (kg/mm²) | 170 | 170 | 200 | 200 |
| Compressive force (kg/mm²) | 17 | 13 | 13 | 14 |
| Seebeck coefficient (μV/K) | −210 | 195 | −190 | 235 |
| Electrical conductivity (1/Ω cm) | 990 | 1170 | 730 | 430 |
| Photograph No. | 2 | 3 | 4 | 5 |

It is apparent from Table 1 that the samples of sintered thermoelectric semiconductor produced in Examples 1 and 2 exhibit satisfactory performance. By contrast, the sample of N-type sintered thermoelectric semiconductor produced in Comparative Example 1 is inferior in both Seebeck coefficient and electrical conductivity to that obtained in Example 1. A probable reason for this is that the rate of hot extrusion is too high (16 mm/s) for the crushed crystal to receive sufficient heat for its complete conversion into the semi-molten state. Also, the sample of P-type sintered thermoelectric semiconductor produced in Comparative Example 2 is by far inferior in electrical conductivity to that obtained in Example 2. A probable reason for this is that the die temperature is so low that the crushed crystal does not receive sufficient heat for its complete conversion into the semi-molten state, as in the case of Comparative Example 1.

The foregoing may be summarized as follows. The sintered thermoelectric semiconductor in each example is proimproved bond at grain boundaries lead to the production of a sintered thermoelectric semiconductor that exhibits improved cooling performance. Incidentally, the die temperature should preferably be lower than 600° C.; an excessively high die temperature causes cracking of the surface of the extrudate.

The fact that the ram speed is controlled in the hot extrusion step such that the extrusion rate of the sintered thermoelectric semiconductor ranges from 4 to 15 mm/s contributes to the complete conversion of the bulk crystal into the semi-molten state, the reduction of extrusion pressure, and the size reduction of manufacturing equipment. The relieving of segregation in the bulk crystal and the improved bond at grain boundaries lead to the production of the sintered thermoelectric semiconductor that exhibits improved cooling performance.

The samples of sintered thermoelectric semiconductor produced in Examples 1 and 2 have crystal grains (resulting from melting and solidifying and differing in crystal orientation) smaller than 10 μm in maximum diameter accounting for 90% and 95%, respectively, by volume (or 90% or above in both cases). This is the result of turning the bulk crystal into a semi-molten state, which leads to a remarkable improvement in cooling performance.

In Example 2, the thermoelectric semiconductor in the form of bulk crystal is a P-type one whose principal component has the composition $Bi_{0.5}Sb_{1.5}Te_{3.0}$. This composition corresponds to the general formula $$Bi_wSb_xTe_ySe_z$$

(where $0.4 \leq w \leq 2.0$, $x \leq 1.6$, $2.7 \leq y \leq 3.25$, $z \leq 0.3$). Therefore, the P-type sintered thermoelectric semiconductor exhibits satisfactory performance.

In Example 1, the thermoelectric semiconductor in the form of bulk crystal is an N-type one whose principal component has the composition $Bi_2Te_{2.85}Se_{0.15}$. This composition corresponds to the general formula $$Bi_wSb_xTe_ySe_z$$

(where $1.4 \leq w \leq 2.0$, $x \leq 0.6$, $2.7 \leq y \leq 3.0$, $z \leq 0.3$). Therefore, the N-type sintered thermoelectric semiconductor exhibits satisfactory performance.

It is concluded from the foregoing that the present invention permits the reduction of steps, the reduction of investment, the saving of space, the improvement of productivity, and the omission of pulverizing step, thereby obviating the necessity of paying attention to the handling of powder, in the production of the sintered thermoelectric semiconductor.

We claim:

1. A process for producing a sintered thermoelectric semiconductor, said process comprising:
    a first step of forming bulk crystals of thermoelectric semiconductor; and
    a second step of hot extrusion which includes substeps of placing said bulk crystals in a cavity of a heated extrusion die, pushing a ram into said cavity, thereby compressing and crushing said bulk crystals and turning them into a molten or semi-molten state, and extruding said molten or semi-molten crystals, thereby sintering said molten or semi-molten crystals and forming a sintered thermoelectric semiconductor.

2. The process for producing a sintered thermoelectric semiconductor as defined in claim 1, wherein the hot extrusion step is carried out while keeping the extrusion die at 250° C. and above.

3. The process for producing a sintered thermoelectric semiconductor as defined in claim 1, wherein the hot extrusion step is carried out by advancing the ram in the cavity at a controlled speed such that the sintered thermoelectric semiconductor is extruded at a rate lower than 15 mm/s.

4. A sintered thermoelectric semiconductor which comprises a sintered body formed from a bulk crystal of thermoelectric semiconductor by hot extrusion in which the bulk crystals are crushed, turned into a molten or semi-molten state, and sintered.

5. The sintered thermoelectric semiconductor as defined in claim 4, in which crystal grains smaller than 10 μm maximum diameter account for 90% and above by volume.

6. The sintered thermoelectric semiconductor as defined in claim 4, wherein the bulk crystal of the thermoelectric semiconductor is a P-type one whose principal component is represented by:

$$Bi_wSb_xTe_yS_z$$

(where $0.4 \leq w \leq 2.0$, $x \leq 1.6$, $2.7 \leq y \leq 3.25$, $z \leq 0.3$).

7. The sintered thermoelectric semiconductor as defined in claim 4, which is characterized in that the bulk crystal of the thermoelectric semiconductor is an N-type one whose principal component is represented by:

$$Bi_wSb_xTe_ySe_z$$

(where $1.4 \leq w \leq 2.0$, $x \leq 0.6$, $2.7 \leq y \leq 3.0$, $z \leq 0.3$).

* * * * *